United States Patent
Matsumoto

(10) Patent No.: US 10,741,413 B2
(45) Date of Patent: Aug. 11, 2020

(54) SEMICONDUCTOR DEVICE AND METHOD FOR MANUFACTURING SEMICONDUCTOR DEVICE

(71) Applicant: Mitsubishi Electric Corporation, Chiyoda-ku (JP)

(72) Inventor: Norihisa Matsumoto, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/083,944

(22) PCT Filed: Jan. 5, 2017

(86) PCT No.: PCT/JP2017/000085
§ 371 (c)(1),
(2) Date: Sep. 11, 2018

(87) PCT Pub. No.: WO2017/195399
PCT Pub. Date: Nov. 16, 2017

(65) Prior Publication Data
US 2020/0058517 A1 Feb. 20, 2020

(30) Foreign Application Priority Data

May 12, 2016 (JP) .................................. 2016-095797

(51) Int. Cl.
*H01L 21/447* (2006.01)
*H01L 21/52* (2006.01)

(52) U.S. Cl.
CPC .. *H01L 21/447* (2013.01); *H01L 2224/11505* (2013.01)

(58) Field of Classification Search
None
See application file for complete search history.

(56) References Cited

U.S. PATENT DOCUMENTS

2009/0230172 A1* 9/2009 Ogashiwa ............... H01L 24/11
228/110.1
2017/0323863 A1* 11/2017 Lee ................... H01L 23/49811

FOREIGN PATENT DOCUMENTS

| JP | 63-38334 U | 3/1988 |
|----|------------|--------|
| JP | 1-76040 U | 5/1989 |
| JP | 2014-135411 A | 7/2014 |

OTHER PUBLICATIONS

International Search Report dated Mar. 21, 2017 in PCT/JP2017/000085 filed Jan. 5, 2017.

* cited by examiner

*Primary Examiner* — Asok K Sarkar
(74) *Attorney, Agent, or Firm* — Xsensus LLP

(57) ABSTRACT

When a semiconductor element is bonded to a base plate electrode, a cushioning is used for protecting the surface of the semiconductor element. A protrusion having an outwardly cutting shape is formed around an area on the base plate electrode for bonding the semiconductor element to disperse and reduce shear force acting on the cushioning during the bonding, so that no cushioning adheres to the surface of the semiconductor element after bonding.

7 Claims, 15 Drawing Sheets

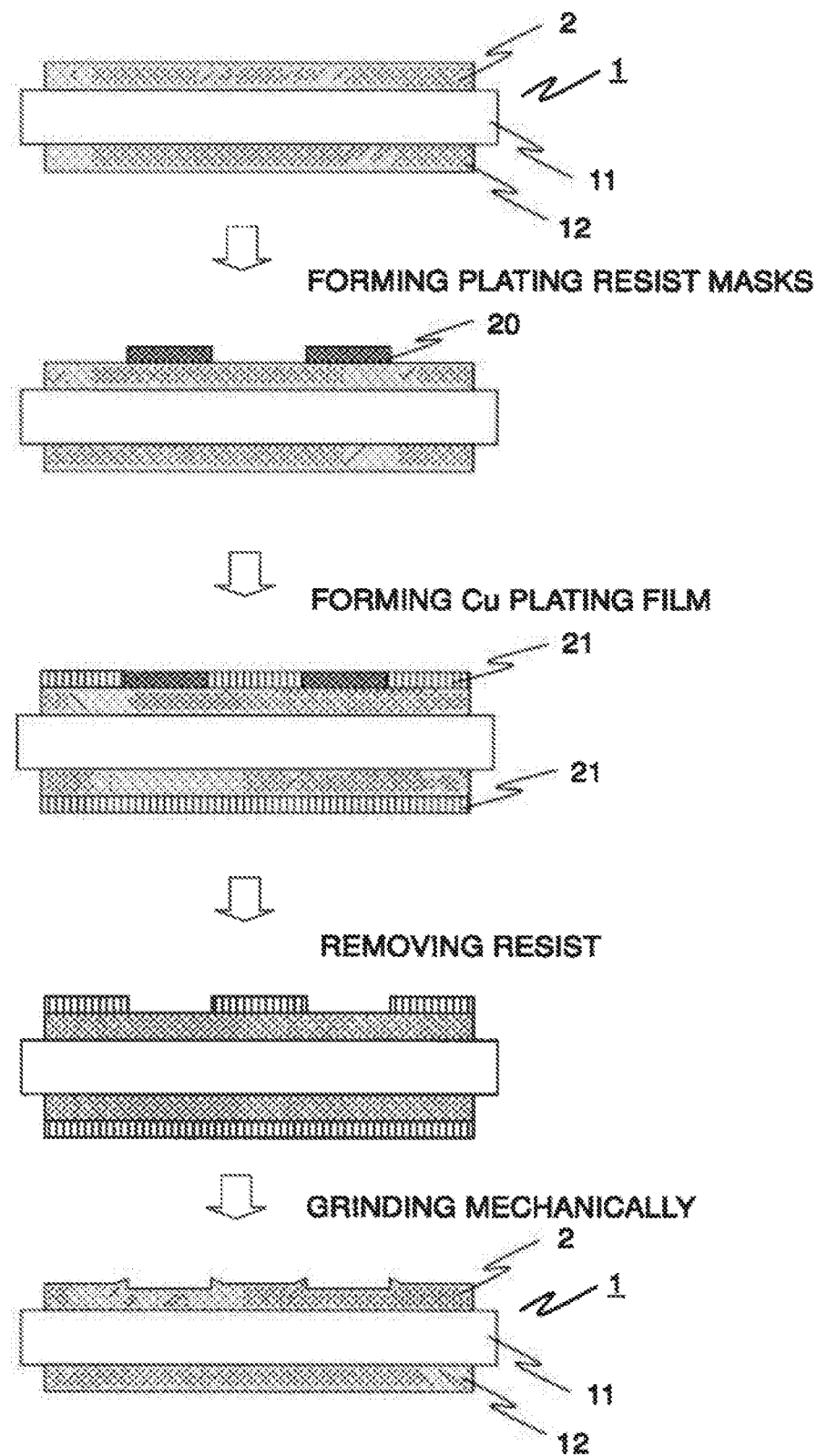

SEMICONDUCTOR DEVICE AND METHOD FOR MANUFACTURING SEMICONDUCTOR DEVICE

TECHNICAL FIELD

The present invention relates to a semiconductor device that is manufactured by bonding a semiconductor element to a base plate with a sinterable metal bonding material, which performs bonding by means of a sintering phenomenon of metal particles, and relates to a method of manufacturing the semiconductor device.

BACKGROUND ART

Pressure sintering bonding using a metal-nanoparticle paste or a metal-microparticle paste has been frequently employed as a bonding method for a high-temperature operating semiconductor element. When a semiconductor element and an electrode of a base plate are bonded by thermal press bonding using a metal-nanoparticle paste or a metal-microparticle paste, a cushioning is ordinarily used for the purpose of protecting the surfaces of electrodes of the semiconductor element.

Conventionally, there is disclosed a semiconductor device in which, in order to prevent, when the semiconductor chip is fixed to the base plate with a conductive bond, the wirings from shorting due to a stuck-out portion of the conductive bond, part of the wiring pattern is cut into a groove to thereby trap the stuck-out conductive bond (see Patent Document 1, for example).

There is also disclosed a resin sealed semiconductor device in which the periphery of a semiconductor pellet mounting part is formed to have a protrusion to thereby keep the wires from drooping between the pellet and the lead frame, so that shorting between the pellet and the wirings can be prevented (see Patent Document 2, for example).

There is further disclosed a semiconductor device in which depressions are formed in parts of the conductor pattern on the insulating base plate to mount semiconductor elements and the ticking-out portion of a sinterable metal bond, which is used to bond the semiconductor elements to the conductor pattern, is sandwiched and pressed between a cushioning and the side faces of the depressions, so that the ticking-out portion of the metal bond can be prevented from dropped off (see Patent Document 3, for example).

PRIOR ART DOCUMENT

Patent Documents

Patent Document 1; Japanese Unexamined Utility Model Application Publication No. S63-038334;
Patent Document 2: Japanese Unexamined Utility Model Application Publication No. H01-076040; and
Patent Document 3: Japanese Unexamined Patent Application Publication No. 2014-135411.

SUMMARY OF THE INVENTION

Problem that the Invention is to Solve

A bonding material (sinterable metal bonding material) used in the sinter bonding technology is composed of metal nano- or micro-particles and an organic solvent. The sinterable metal bond establishes metallic connection between wiring conductors to be bonded by means of the sintering phenomenon of metal particles. Unlike soldering, which establishes metallic connection with melting, the sinterable metal bond establishes metallic connection without melting. Thus, the bonding technology utilizing the sintering phenomenon of metal particles is often employed for power module products that are needed to have high thermal resistance.

In the bonding technology, a sinterable metal bond and to-be-bonded members need to be pressed with them being heated when they are bonded to each other, which substantially differs from the conventional solder bonding technology. Without supplying pressure, the sintering process does not sufficiently proceed, resulting in a fragile structure owing to a weak binding state of the metal particles. It should be noted that the semiconductor element to be bonded is integrated with various transistors laminated therein and electrodes exposed to the surface thereof.

Incidentally, if the semiconductor element is pressed directly by a pressing machine, a break of the various transistors in the semiconductor element or of the electrodes on the surface thereof may occur. For that reason, for the purpose of protecting the surface of the semiconductor element, a cushioning is often interposed between the press head of the pressing machine and the semiconductor element to perform thermal press bonding. Considering the pressing force and the heating temperature for the bonding, fluorine resin, such as polytetrafluoroethylene (PTFE) having high resilience and high thermal resistance, is often used as a material of the cushioning. However, when an excess pressure is applied to a fluorine resin such as PTFE, the fluorine resin is torn off into fibrous pieces by shear force and the thermal pressing may in some cases cause the fibrous pieces to adhere to the surface of the semiconductor element.

Since the fibrously torn-off fluorine resin thus adhered is difficult to remove easily, contamination of a semiconductor element with adhesion of the fibrous resin pieces into power module products may in some cases cause problems such as possibility of inducing a malfunction of the products and/or a low product yield in the later wire bonding step.

Also in the semiconductor devices disclosed in the above-mentioned Patent Documents 1 to 3, when the semiconductor element and the base plate electrode are bonded by thermal press bonding using a sinterable metal bond, since shear force acts on the cushioning, such as fluorine resin, at the edge of the semiconductor element, torn-off pieces of the cushioning are highly likely to adhere to the surface of the semiconductor element; it is expected that a malfunction of the power module product frequently occurs. Furthermore, even though part of or all inventions disclosed in Patent documents 1 to 3 are employed, the above-mentioned problems cannot be resolved.

The present invention is made to resolve the above-described problems and is aimed at preventing a cushioning, which is used in thermal pressing of a sinterable metal bond, from adhering to the surface of the semiconductor element.

Means for Solving the Problem

In a semiconductor device according to the present invention, shear force acting on a cushioning is dispersed and reduced by the following four methods when the semiconductor element is bonded to a base plate electrode, so that the surface of the semiconductor element can be kept clean with no adhesion of the cushioning.

In a first method, the base plate electrode is formed to have a protrusion that is capable of dispersing and reducing the shear force acting on the cushioning and encloses an area for mounting the semiconductor element, and the semiconductor element is placed on the area and then thermal press bonding is performed, whereby the cushioning is prevented from adhering the surface of the semiconductor element.

In a second method, the base plate electrode is formed to have a depression for being coated with a bonding paste at the area for mounting the semiconductor element and further to have around the depression a protrusion that is capable of dispersing and reducing the shear force acting on the cushioning, to prevent the cushioning from adhering the surface of the semiconductor element.

In a third method, the end faces (side faces; the same applies hereinafter) of the semiconductor element to be mounted are formed into an arch shape or a beveled shape that is capable of dispersing and reducing the shear force acting on the cushioning, to prevent the cushioning from adhering the surface of the semiconductor element.

In a fourth method, a jig that has an acute angled top capable of dispersing and reducing the shear force acting on the cushioning is placed around the area for mounting the semiconductor element on the base plate electrode, and the semiconductor element is placed on the area and thermal press bonding is performed, and then the jig is detached, whereby the cushioning is prevented from adhering the surface of the semiconductor element.

Advantage Effect of the Invention

According to a semiconductor device of the present invention, forming an electrode on the base plate to have a protrusion for or using a jig having an acute angled top for dispersing and reducing shear force acting on a cushioning, which is used in thermal press bonding of a semiconductor element to the base plate, allows for preventing the cushioning from adhering to the surface of the semiconductor element.

BRIEF DESCRIPTION OF THE DRAWINGS

FIG. 3 is a series of diagrams illustrates an example of a base plate electrode forming method by plating a Cu film, according Embodiment 1 of the present invention;

EMBODIMENTS FOR CARRYING OUT THE INVENTION

Embodiment 1

Figure 1:
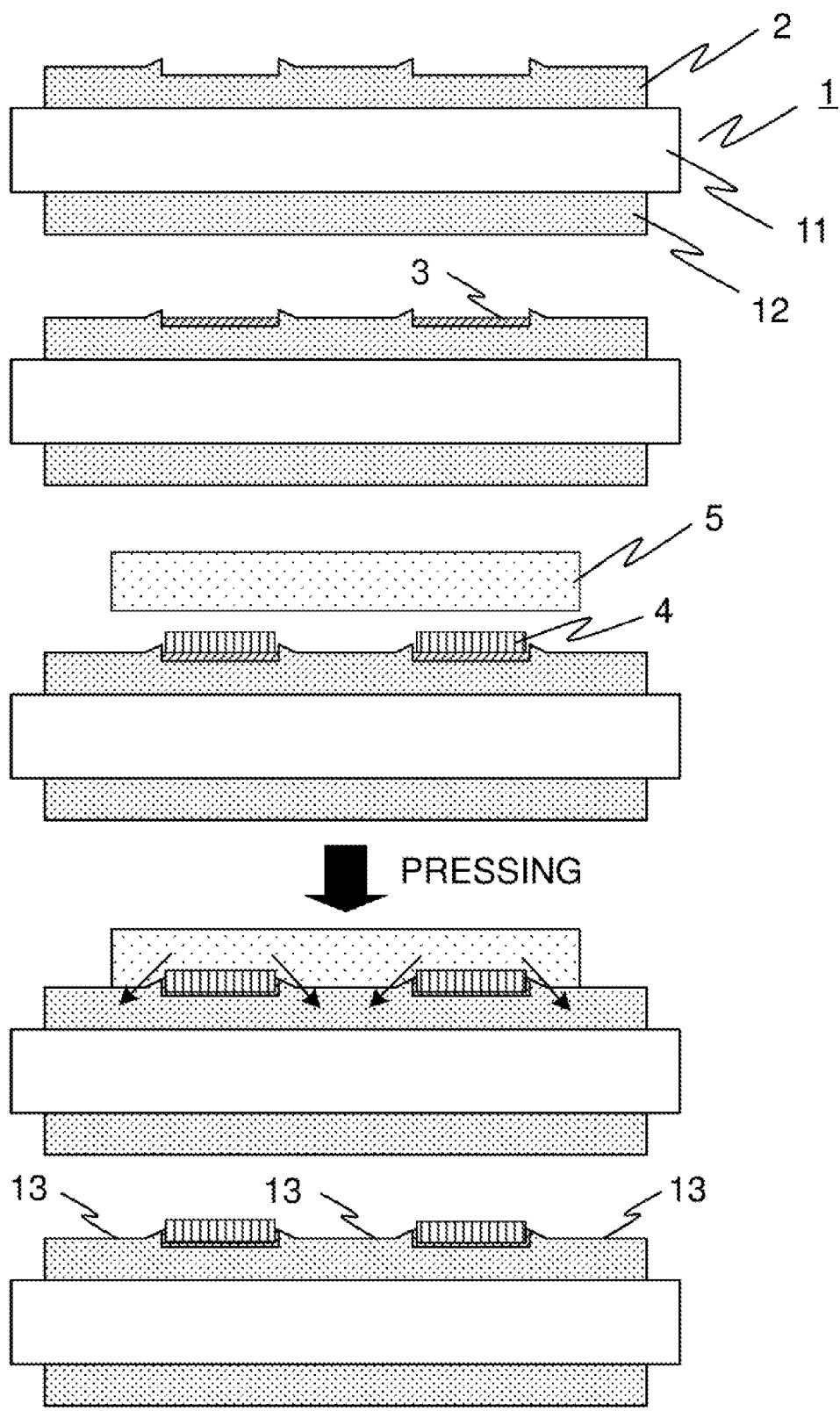
FIG. 1 is a series of diagrams for explaining a bonding method for a semiconductor device according to Embodiment 1 of the present invention.
Figure 2A:
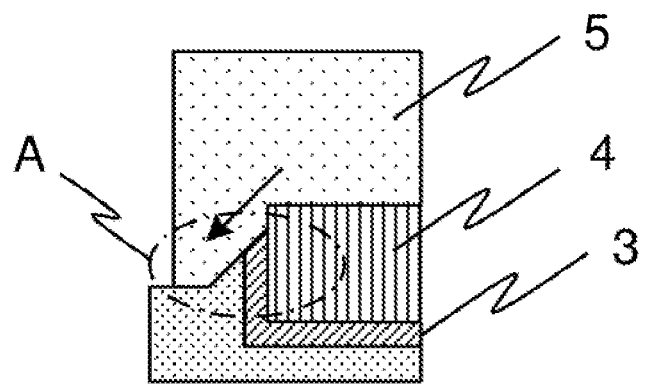
FIGS. 2A and 2B are enlarged diagrams, among the diagrams in FIG. 1, showing the end portion of a semiconductor element used in the semiconductor device when thermally pressing processed.
Figure 2B:
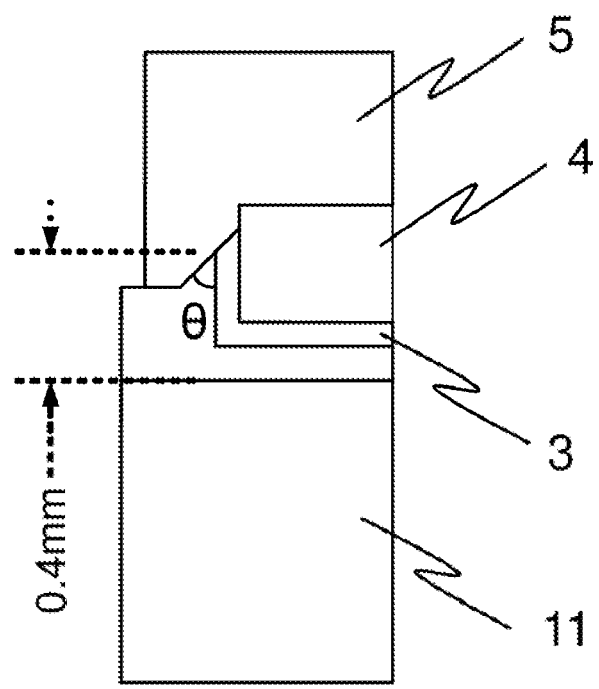

FIG. 1 is a series of schematic diagrams for explaining a bonding method for a semiconductor device according to Embodiment 1 of the present invention, and FIGS. 2A and 2B are enlarged diagrams, among the diagrams in FIG. 1, showing the end portion (side face; the same applies hereinafter) of a semiconductor element used in the semiconductor device when thermally pressing processed. In Embodiment 1, an insulating base plate 1 (hereinafter, simply referred to as a base plate 1) of 50 mm square and 1.3 mm thickness is used that is made up of a $Si_3N_4$ ceramic plate 11 (0.6 mm thickness), and a Cu electrode (0.4 mm thickness) brazed, as a base plate electrode 2 for mounting the semiconductor elements 4, to one side of the ceramic plate and a rear electrode 12 (Cu electrode of 0.3 mm thickness) brazed to the other side thereof. The base plate electrode is formed to have two countersinks of 10.1 mm square and 0.1 mm depth at chip bonding areas and 0.1 mm-height wedge-like protrusions, each having an outward inclined face, along the peripheries of the countersinks (see the portion enclosed by the dot-dash line A in FIG. 2A).

The depression (countersink) and the protrusion are formed by mechanical grinding, so that the flat portion 13, where the semiconductor element 4 is not mounted, has a thickness of 0.3 mm, the depression for mounting the semiconductor element 4 has a thickness of 0.2 mm, and the top of the protrusion has a height of 0.4 mmm from the ceramic plate 11 (0.6 mm thickness).

While the 0.4 mm-thickness Cu base plate electrode is used here, the electrode may be formed of a 0.3 mm-thickness Cu plate and a Cu film selectively plated around the area for mounting the semiconductor element 4 on the Cu plate by electrolytic plating to a thickness of 0.1-0.2 mm (see FIG. 3).

FIG. 3 illustrates a method of selectively forming the Cu plating film. Plating resist masks each having a size of 10.1 mm square are formed selectively on the 0.3 mm-thickness Cu electrode at areas for mounting the semiconductor elements 4 by means of photolithography.

Next, Cu films 21 are plated to a thickness of about 0.1 mm in an Cu electrolytic plating solution while passing current through the surface electrode and the rear electrode of the base plate, to form a 0.4 mm-thickness Cu electrode partially on the surface side and a 0.4 mm-thickness Cu electrode on the rear side. Next, the surface side is mechanically grinding partially to form the protrusions around the areas for mounting semiconductor elements.

The sizes of the depression and the protrusion are determined according to the 0.3 mm thickness of the semiconductor element 4 to be mounted and a bond thickness of 0.05 mm after the sinterable metal bond 3 (hereinafter, simply referred to as "bond") sinters. That is, the sizes of the depression and the protrusion also need to be altered depending on the thickness of the semiconductor element 4 to be mounted and the bond thickness of the sintered metal bond.

The size of the semiconductor element 4 used here is 10 mm square and 0.3 mm thickness. Further, the top of the protrusion is formed to have an outward angle θ of 45 degrees with respect to the vertical side face of the semiconductor element 4. In order to more disperse shear force acting on the cushioning 5, the angle θ preferably ranges from 45 degrees to less than 90 degrees.

Next, part of the base plate 1 is coated with the sinterable metal bonding paste (bond 3) containing Ag nanoparticles. To be more specific, the 10.1 mm-square depression formed in the electrode of the base plate 1 is coated with the sinterable metal bonding paste (bond 3). The coating amount is such that the bond thickness becomes 50 μm after the thermal press bonding.

The depression are formed intentionally larger in size than the semiconductor element 4 for the stuck-out portion of the sinterable metal bonding paste (bond 3) to be rolled up to the side face of the semiconductor element 4 during the thermal press bonding, so that the semiconductor element 4 is bonded to the base plate electrode 2 at the rear face (bottom face; the same applies hereinafter) of the semiconductor element 4 and the end faces (side faces; the same applies hereinafter) thereof, thus increasing the bonding strength. In other words, the bond 3 becomes a container-like shape having a bottom face and side faces. This allows the power module product to be enhanced in bonding reliability and in product quality.

The coated sinterable metal bonding paste (the bond 3) is dried by heating at 50-200° C. to remove the organic solvent content. Specifically, heating at 80° C. for 30 minutes is performed to remove the organic solvent content contained in the paste.

The semiconductor element 4 is placed on the dried sinterable metal bonding paste (bond 3), and then heating at 200-400° C. is performed while applying a pressure of 10-50 MPa, to sinter the Ag nanoparticles. Specifically, a PTFE sheet of 40 mm square and 1 mm thickness is placed as the cushioning 5 on the plurality of semiconductor elements 4 so as to cover all of them together, and heating at a temperature of 280° C. for 15 minutes is performed with a pressure of 30 MPa being applied via the cushioning 5, to bond the semiconductor elements 4 to the base plate electrode 2.

At that time, the protrusion of the base plate electrode 2 mitigates the shear force acting on the cushioning 5 at the edge of the semiconductor element 4 and disperses the force outwardly from the semiconductor element 4, whereby the cushioning 5, although plastically deformed, is not fractured. Thus, the bonding can be performed without the cushioning 5 being torn-off into fibrous pieces and being adhered to the surface of the semiconductor element 4. Note that the top portion of the sintered bond 3 also becomes inclined as shown in FIG. 2A. Such a shape is formed by downward pressing by the PTFE deformed and varies depending on the coating amount of the paste. When the coating amount of the past is deficient, the top portion becomes a round shape (semi-cylindrical shape). When the coating amount is excess, on the other hand, the top portion becomes inclined; however, the overflow portion of the paste remains in an Ag-particle state and is extruded out along with the PTFE. In addition, although a detail explanation is omitted, the cushioning 5 becoming unnecessary at this stage after the bonding is removed by an appropriate method.

After the bonding, the base plate 1 is reflow soldered to another base plate in a reducing atmosphere and attached to a module case, and then wire bond connection and resin sealing are performed. In this way, the semiconductor module is manufactured. If a foreign substance originating from the cushioning sticks to the surface of the semiconductor element 4, a trouble such as poor wire bonding may occur in a step, for example, the wire bonding step after the sinter bonding step. However, since there is no sticking of such a foreign substance to the surface of the semiconductor element 4 bonded in the way as described in the present embodiment, no fault is detected in the wire bonding step. In addition, when a bonding with the sinterable metal was performed as a comparative example using a base plate having a base plate electrode 2 with no protrusion for mitigating the shear force acting on the cushioning 5, a fault owing to poor wire bonding was detected in the later wire bonding step.

As described above, according to the invention of the present embodiment, the cushioning 5 used in the thermal press bonding with a sinterable metal bond can be prevented from adhering to the surface of the semiconductor element 4.

Embodiment 2

Figure 4:
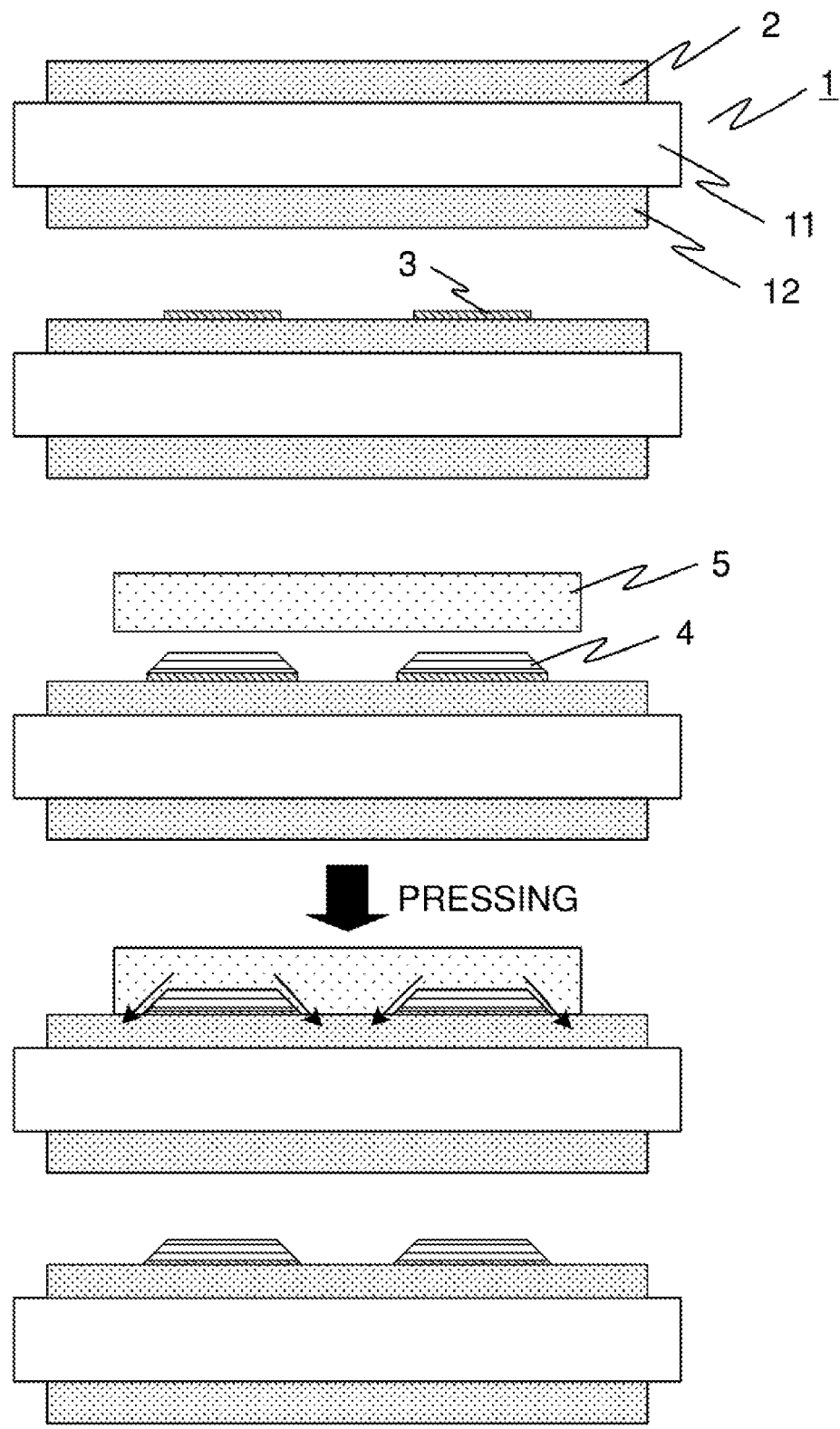
FIG. 4 is a series of diagrams for explaining a bonding method for a semiconductor device according to Embodiment 2 of the present invention.
Figure 5:
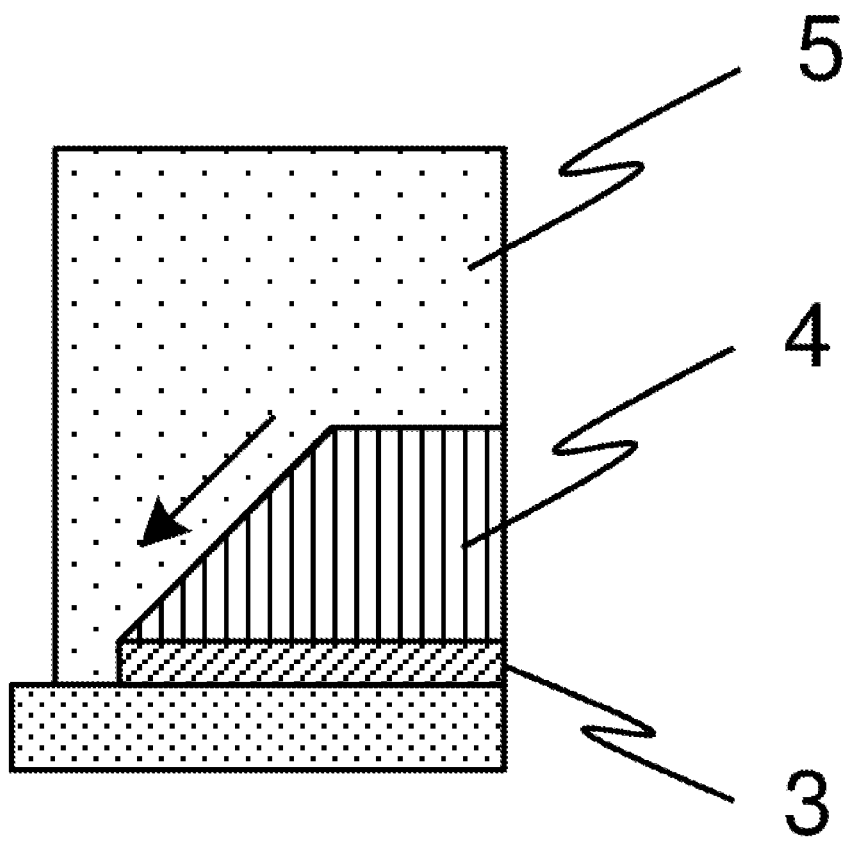
FIG. 5 is an enlarged diagram, among the diagrams in FIG. 4, showing the end portion of a semiconductor element used in the semiconductor device when thermally pressing processed.

FIG. 4 is a series of schematic diagrams for explaining a bonding method for a semiconductor device according to Embodiment 2 of the present invention, and FIG. 5 is an enlarged diagram, among the diagrams in FIG. 4, showing the end portion of a semiconductor element 4 used in the semiconductor device when thermally pressing processed.

In Embodiment 2, a base plate 1 of 50 mm square and 1.2 mm thickness is used that is made up of a $Si_3N_4$ ceramic plate 11 (0.6 mm thickness) and Cu electrodes (0.3 mm thickness), one of which is the base plate electrode for mounting the semiconductor elements 4, brazed to both sides of the ceramic plate.

The semiconductor element 4 to be mounted has a thickness of 0.3 mm and side faces that are bevel-grinded at an outward angle of 45 degrees (the angle θ shown in FIG. 2B is 45 degrees) so that a cross-sectional shape of the side face of the semiconductor element 4 increases in width downward from an upper surface in the thicknesswise direction of the semiconductor element. In addition, the semiconductor element 4 used here is a SiC semiconductor element. A mechanical grinding using a resinoid grindstone is employed here for grinding the entire side face of the semiconductor element 4. In order to more disperse the shear force acting on the cushioning 5, the angle θ desirably ranges from 45 degrees to less than 90 degrees.

Next, part of the base pale 1 is print-coated with the sinterable metal bonding paste (bond 3) containing Ag nanoparticles. To be more specific, desired areas of the surface of the base plate electrode, each area having a size of 10 mm square, which is the same as that of the rear-side electrode of the semiconductor element 4, are coated with the sinterable metal bonding paste (bond 3) using a screen printer. The coating amount is such that the bond thickness becomes 50 μm as a guideline after the thermal press bonding.

The print-coated sinterable metal bonding paste (bond 3) is dried by heating at 50-200° C. to remove the organic solvent content. Specifically, heating at 150° C. for 15 minutes is performed to remove the organic solvent content contained in the paste.

The semiconductor element 4 is placed on the dried sinterable metal bonding paste (bond 3), and then heating at 200-400° C. is performed while applying a pressure of 10-50 MPa, to sinter the Ag nanoparticles.

Specifically, the PTFE sheet of 40 mm square and 1 mm thickness is placed as the cushioning 5 on the plurality of semiconductor elements 4 so as to cover all of them together, and heating at 280° C. for 5 minutes is performed with a pressure of 30 MPa being applied via the cushioning 5, to bond the semiconductor elements 4 to the base plate electrode 2.

At that time, the beveled side face of the semiconductor element 4 disperses outwardly from the semiconductor element 4 the shear force acting on the cushioning 5, whereby the cushioning 5, although plastically deformed, is not fractured. Thus, the bonding can be performed without the cushioning 5 being torn-off into fibrous pieces and being adhered to the surface of the semiconductor element 4.

After the bonding, the base plate 1 is reflow soldered to another base plate in a reducing atmosphere and attached to a module case, and then wire bond connection and resin sealing are performed. In this way, the semiconductor module is manufactured. If a foreign substance originating from the cushioning 5 sticks to the surface of the semiconductor element 4, a trouble such as poor wire bonding may occur in a step, for example, the wire bonding step after the bonding step. However, since there is no sticking of such a foreign substance to the surface of the semiconductor element 4 bonded according to the invention of the present embodiment, no fault is detected in the wire bonding step.

As described above, according to the present invention, the cushioning 5 used in the thermal pressing bonding with a sinterable metal bond can be prevented from adhering to the surface of the semiconductor element 4.

Embodiment 3

Figure 6:
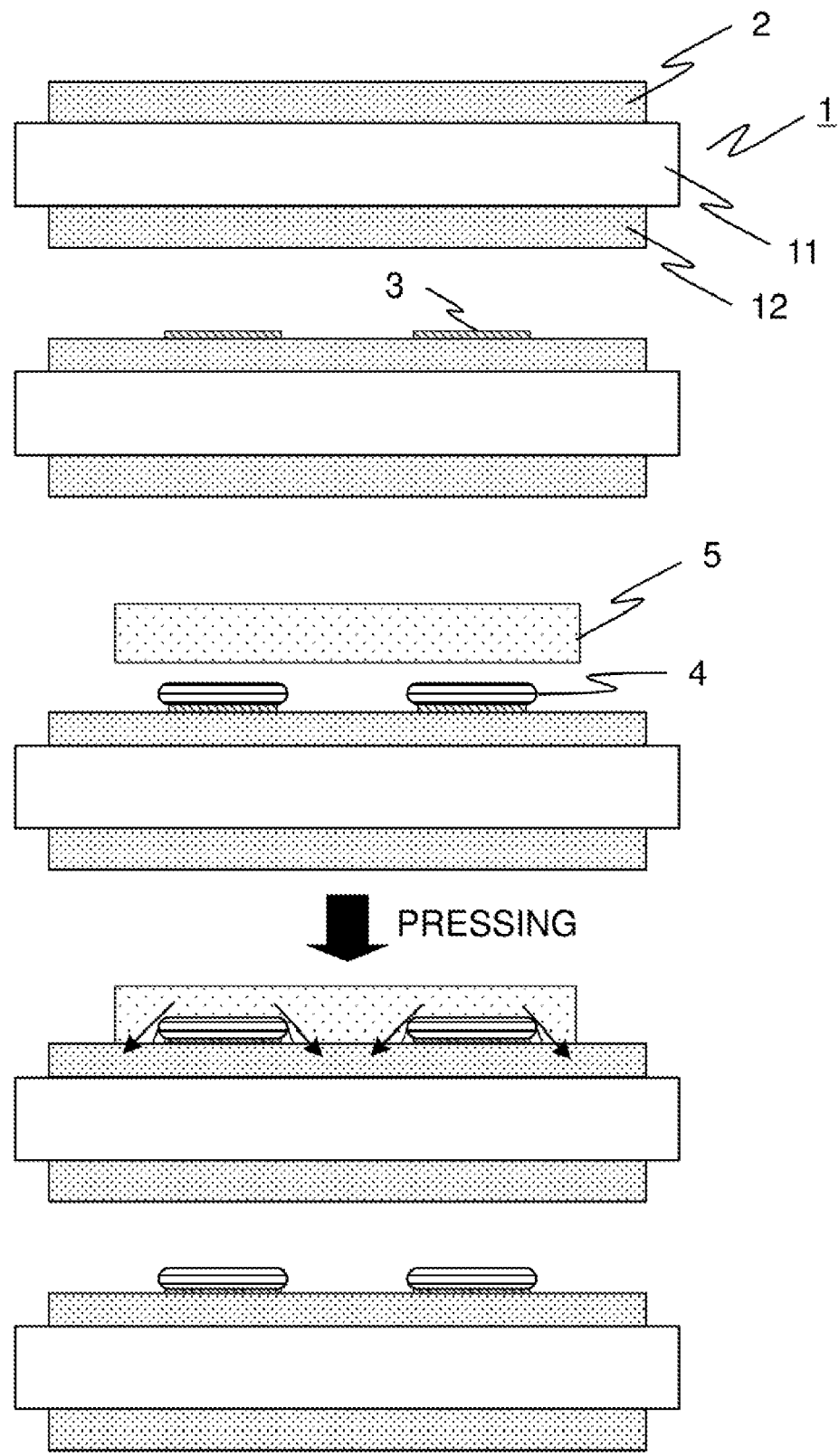
FIG. 6 is a series of diagrams for explaining a bonding method for a semiconductor device according to Embodiment 3 of the present invention.
Figure 7:
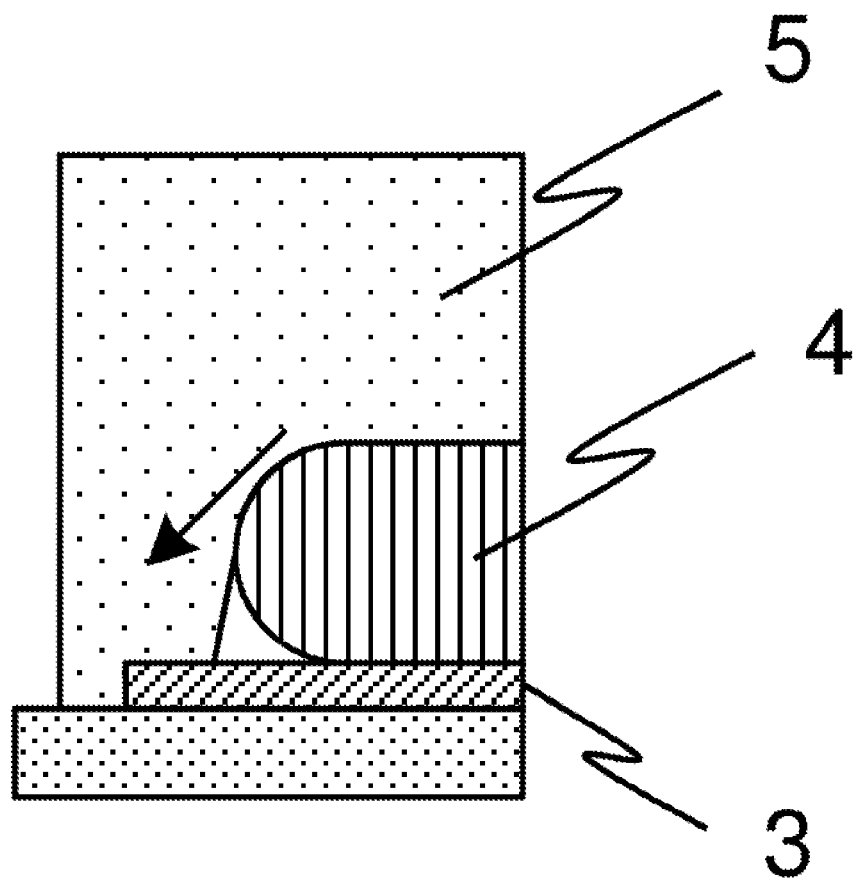
FIG. 7 is an enlarged diagram, among the diagrams in FIG. 6, showing the end portion of a semiconductor element used in the semiconductor device when thermally pressing processed.

FIG. 6 is a series of schematic diagrams for explaining a bonding method for a semiconductor device according to Embodiment 3 of the present invention, and FIG. 7 is an enlarged diagram, among the diagrams in FIG. 6, showing the end portion of a semiconductor element 4 used in the semiconductor device when thermally pressing processed.

A base plate 1 of 50 mm square and 1.2 mm thickness is used that is made up of a $Si_3N_4$ ceramic plate 11 (0.6 mm thickness) and Cu electrodes (0.3 mm thickness), one of which is the base plate electrode for mounting the semiconductor elements 4, brazed to both sides of the ceramic plate.

The semiconductor element 4 to be mounted has a thickness of 0.3 mm and side faces that are grinded into an arc shape. In addition the semiconductor element 4 used here is a Si semiconductor element. A mechanical grinding using a resinoid grindstone is employed for grinding the entire side face of the semiconductor element 4. In order to more disperse the shear force acting on the cushioning 5, the radius of the arc shape is desirably more than a half of the thickness of the semiconductor element 4.

Next, part of the base plate 1 is print-coated with the sinterable metal bonding paste (bond 3) containing Ag nanoparticles. To be more specific, desired areas of the surface of the base plate electrode, each area having a size of 10 mm square, which is the same as that of the rear-side electrode of the semiconductor element 4, are coated with the sinterable metal bonding paste (bond 3) using a screen printer. The coating thickness is such that the bond thickness becomes 50 μm after the thermal press bonding.

The print-coated sinterable metal bonding paste (bond 3) is dried by heating at 50-200° C. to remove the organic solvent content. Specifically, heating at 150° C. for 15 minutes is performed to remove the organic solvent content contained in the paste.

The semiconductor element 4 is placed on the dried sinterable metal bonding paste (bond 3), and then heating at 200-400° C. is performed while applying a pressure of 10-50 MPa, to sinter the Ag nanoparticles. Specifically, the PTFE sheet of 40 mm square and 1 mm thickness is placed as the cushioning 5 on the plurality of semiconductor elements 4 so as to cover all of them together, and heating at 280° C. for 5 minutes is performed with a pressure of 30 MPa being applied via the cushioning 5, to bond the semiconductor elements 4 to the base plate electrode 2.

At that time, the arc-shape side face of the semiconductor element 4 disperses outwardly from the semiconductor element 4 the shear force acting on the cushioning 5, whereby the cushioning 5, although plastically deformed, is not fractured. Thus, the bonding can be performed without the cushioning 5 being torn-off into fibrous pieces and being adhered to the surface of the semiconductor element 4.

After the bonding, the base plate 1 is reflow soldered to another base plate in a reducing atmosphere and attached to a module case, and then wire bond connection and resin sealing are performed. In this way, the semiconductor module is manufactured. If a foreign substance originating from the cushioning 5 sticks to the surface of the semiconductor element 4, a trouble such as poor wire bonding may occur in a step, for example, the wire bonding step after the bonding step. However, since there is no sticking of such a foreign substance to the surface of the semiconductor element 4, no fault is detected in the wire bonding step.

As described above, according to the present invention, the cushioning 5 used in the thermal press bonding of the semiconductor element to the base plate with the bond 3, which is a sinterable metal bond, can be prevented from adhering to the surface of the semiconductor element 4.

Embodiment 4

Figure 8:
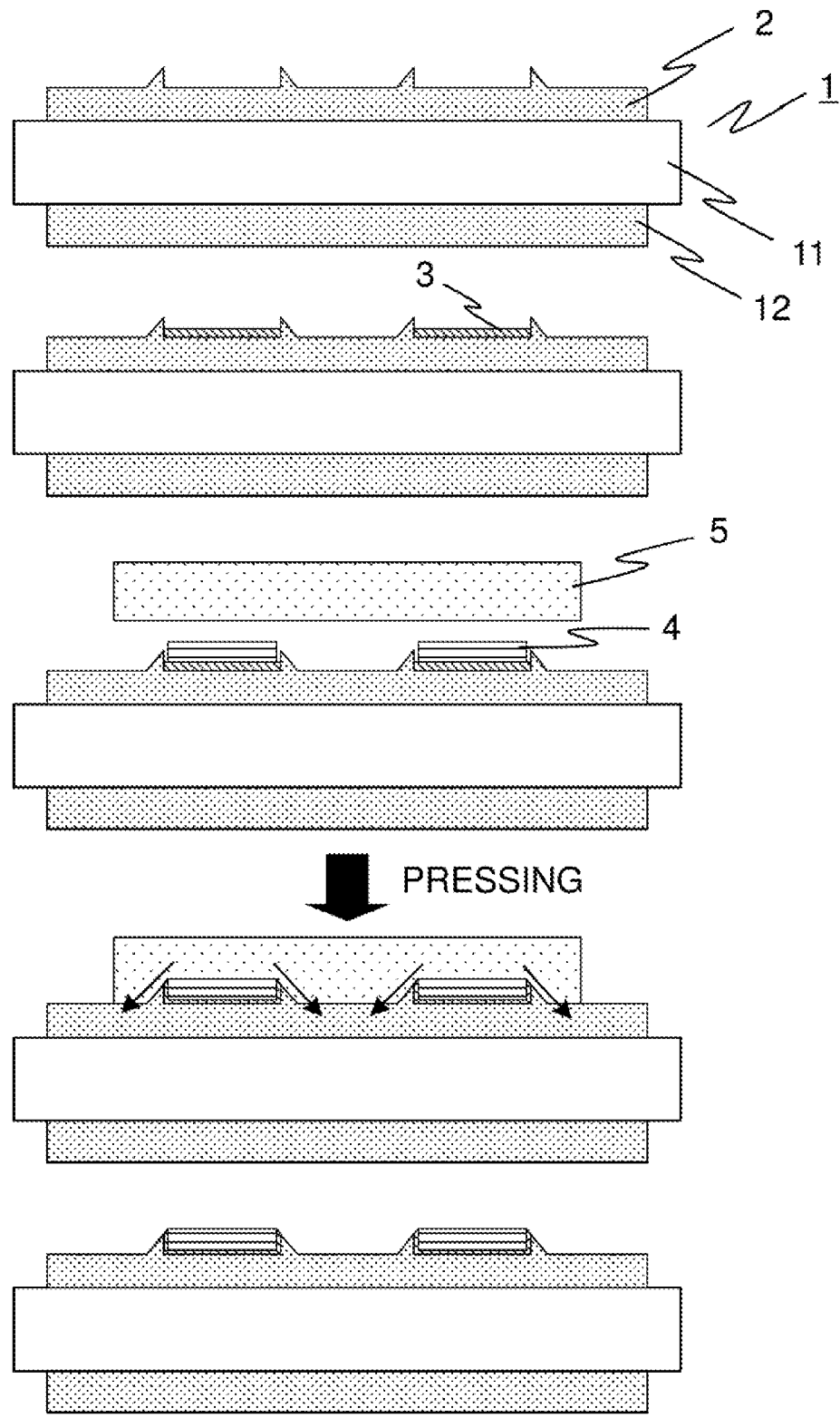
FIG. 8 is a series of diagrams for explaining a bonding method for a semiconductor device according to Embodiment 4 of the present invention.
Figure 9:
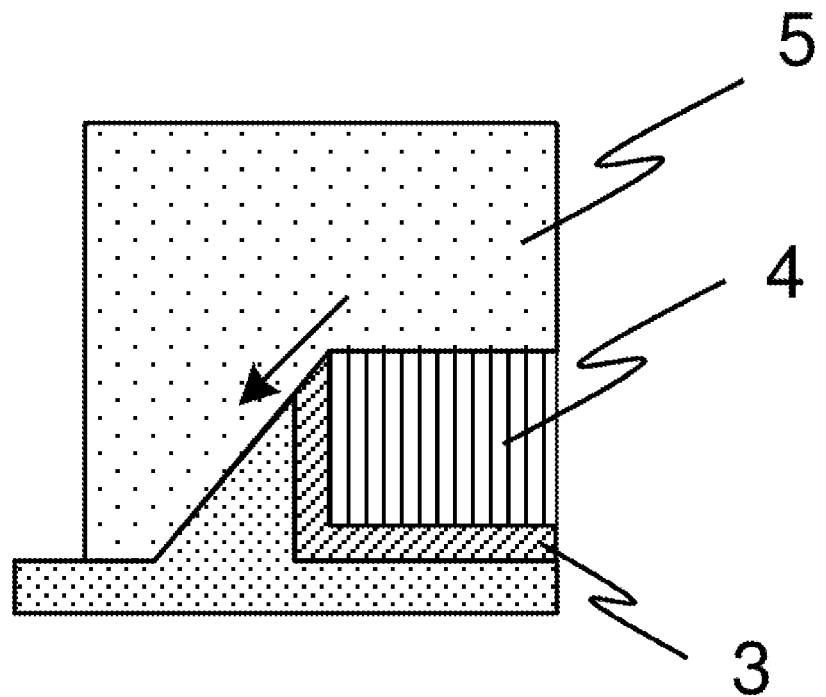
FIG. 9 is an enlarged diagram, among the diagrams in FIG. 8, showing the end portion of a semiconductor element used in the semiconductor device when thermally pressing processed.

FIG. 8 is a series of schematic diagrams for explaining a bonding method for a semiconductor device according to Embodiment 4 of the present invention, and FIG. 9 is an enlarged diagram, among the diagrams in FIG. 8, showing the end portion of a semiconductor element 4 used in the semiconductor device when thermally pressing processed.

A base plate 1 of 50 mm square and 1.3 mm thickness is used that is made up of an $Al_2O_3$ ceramic plate 11 (0.6 mm thickness), and a Cu base plate electrode (0.4 mm thickness) for mounting the semiconductor elements 4, brazed to one side of the ceramic plate and a Cu electrode (0.3 mm thickness) brazed to the other side thereof. The base plate electrode is formed to have 0.1 mm-height wedge-like protrusions, each having an outward inclined face, along the peripheries of the areas for mounting the semiconductor elements 4.

The protrusion is formed by mechanical grinding. While the 0.4 mm-thickness Cu base plate electrode is used here, the electrode may be formed of a 0.3 mm-thickness Cu plate and a Cu film that is selectively plated around the area for mounting the semiconductor element 4 on the Cu plate by electrolytic plating to a thickness of 0.1-0.2 mm.

The height of the protrusion is determined according to the 0.3 mm thickness of the semiconductor element 4 to be mounted and a bond thickness of 0.05 mm after the sinterable metal bond sinters. That is, the sizes of the protrusion also need to be altered depending on the thickness of the semiconductor element 4 to be mounted and the bond thickness of the sintered metal bond. The size of the semiconductor element 4 used here is 10 mm square and 0.3 mm thickness.

Further, the top of the protrusion is formed to have an outward angle θ of 45 degrees with respect to the vertical side face of the semiconductor element 4. In order to more disperse the shear force acting on the cushioning 5, the angle preferably ranges from 45 degrees to less than 90 degrees.

Next, part of the base plate 1 is coated with the sinterable metal bonding paste (bond 3) containing Ag nanoparticles. To be more specific, the 10.1 mm-square depression formed in the base plate electrode is coated with the sinterable metal bonding paste (bond 3). The coating amount is such that the bond thickness becomes 50 μm after the thermal press bonding. The area enclosed by the protrusion is formed intentionally larger than that of the semiconductor element 4 for the stuck-out portion of the sinterable metal bonding paste (bond 3) to be rolled up to the side faces of the semiconductor element 4 during the thermal press bonding, so that the semiconductor element 4 is bonded to the base plate electrode 2 at the rear face of the semiconductor element 4 and the side faces thereof, thus increasing the bonding strength. This allows the power module product to be enhanced in bonding reliability and in product quality.

The coated sinterable metal bonding paste (the bond 3) is dried by heating at 50-200° C. to remove the organic solvent content. Specifically, heating at 80° C. for 30 minutes is performed to remove the organic solvent content contained in the paste.

The semiconductor element 4 is placed on the dried sinterable metal bonding paste (the bond 3), and then heating at 200-400° C. is performed while applying a pressure of 10-50 MPa, to sinter the Ag nanoparticles. Specifically, the PTFE sheet of 40 mm square and 1 mm thickness is placed as the cushioning 5 on the plurality of semiconductor elements 4 so as to cover all of them together, and then heating at a temperature of 280° C. for 15 minutes is performed with a pressure of 30 MPa being applied via the cushioning 5, to bond the semiconductor elements 4 to the base plate electrode 2.

At that time, the protrusion of the base plate electrode mitigates the shear force acting on the cushioning 5 at the edge of the semiconductor element 4 and disperses the force outwardly from the semiconductor element 4, whereby the cushioning 5, although plastically deformed, is not fractured. Thus, the bonding can be performed without the cushioning 5 being torn-off into fibrous pieces and being adhered to the surface of the semiconductor element 4.

After the bonding, the base plate 1 is reflow soldered to another base plate in a reducing atmosphere and attached to a module case, and then wire bond connection and resin sealing are performed. In this way, the semiconductor module is manufactured. If a foreign substance originating from the cushioning 5 sticks to the surface of the semiconductor element 4, a trouble such as poor wire bonding may occur in a step, for example, the wire bonding step after the bonding step. However, since there is no sticking of such a foreign substance to the surface of the semiconductor element 4, no fault is detected in the wire bonding step.

As described above, according to the present invention, the cushioning 5 used in the thermal press bonding with a sinterable metal bond can be prevented from adhering to the surface of the semiconductor element 4.

Embodiment 5

Figure 10:
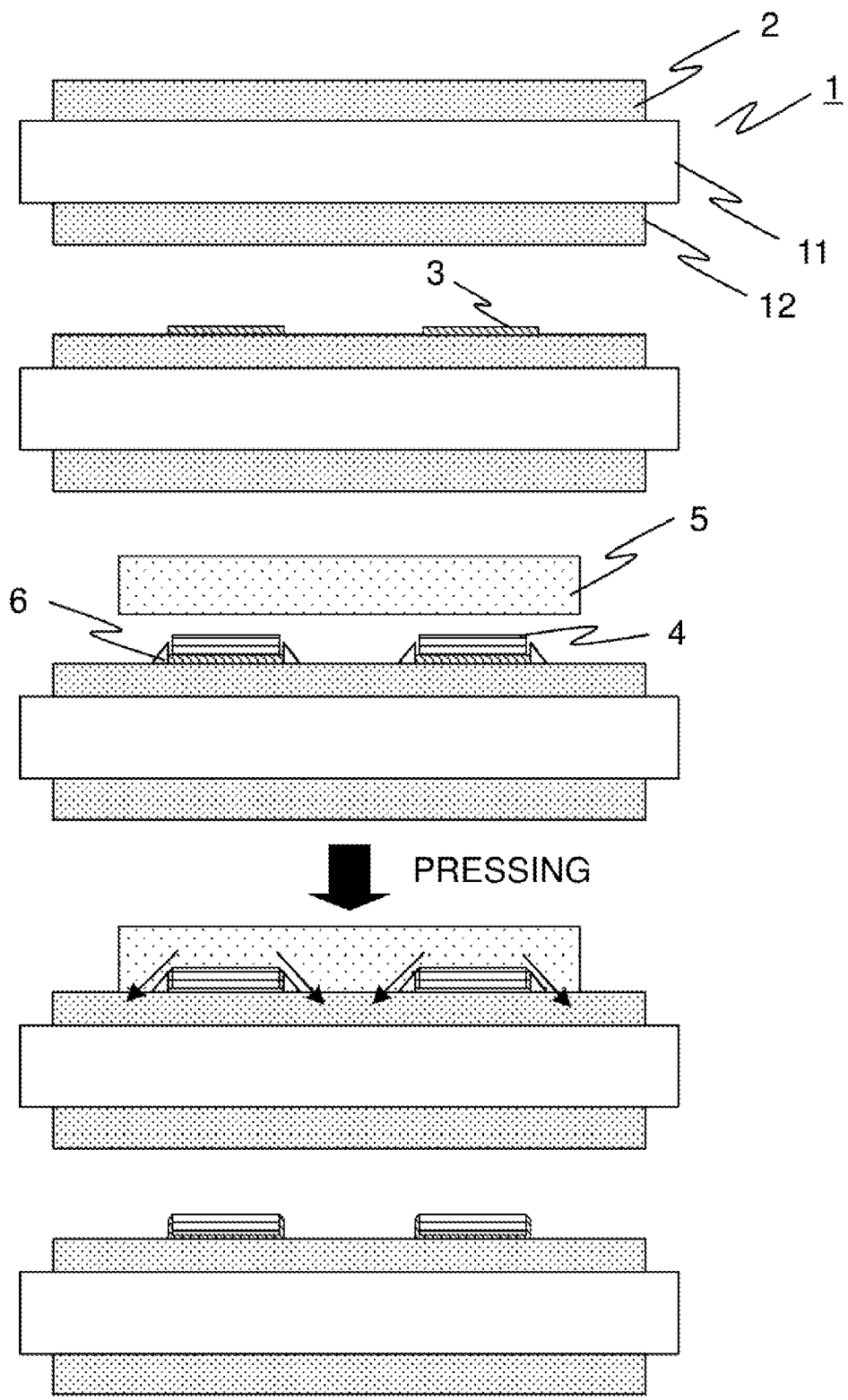
FIG. 10 is a series of diagrams for explaining a bonding method for a semiconductor device according to Embodiment 5 of the present invention.
Figure 11:
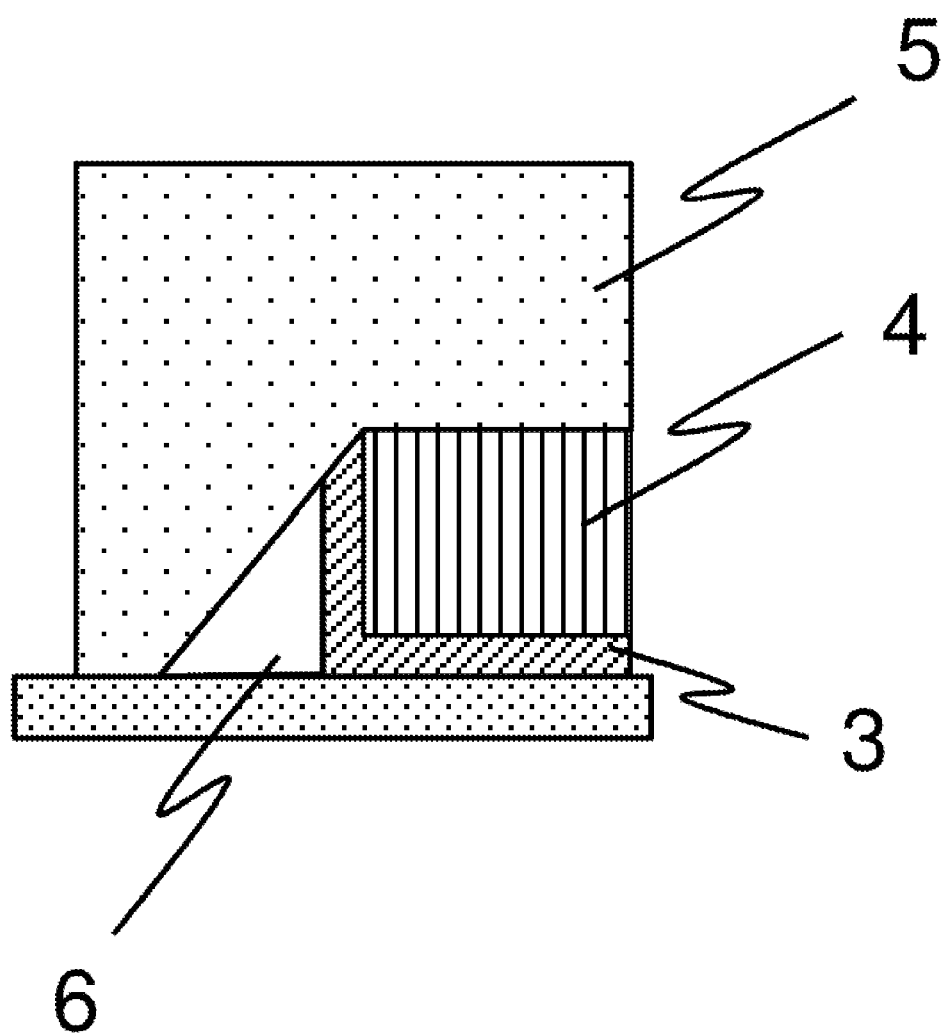
FIG. 11 is an enlarged diagram, among the diagrams in FIG. 10, showing the end portion of a semiconductor element used in the semiconductor device when thermally pressing processed.

FIG. 10 a series of schematic diagrams for explaining a bonding method for a semiconductor device according to Embodiment 5 of the present invention, and FIG. 11 is an enlarged diagram, among the diagrams in FIG. 10, showing the end portion of a semiconductor element 4 used in the semiconductor device when thermally pressing processed.

A base plate 1 of 50 mm square and 1.2 mm thickness is used that is made up of a $Si_3N_4$ ceramic plate 11 (0.6 mm thickness) and Cu electrodes (0.3 mm thickness), one of which is for mounting the semiconductor elements 4, brazed to both sides of the ceramic plate.

Next, part of the base plate 1 is print-coated with the sinterable metal bonding paste (bond 3) containing Ag nanoparticles. To be more specific, desired areas of the surface of the base plate electrode, each area having a size of 10 mm square, which is the same as that of the rear-side electrode of the semiconductor element 4, are coated with the sinterable metal bonding paste (bond 3) using a screen printer. The coating thickness is such that the bond thickness becomes 50 μm after the thermal press bonding.

The print-coated sinterable metal bonding paste (bond 3) is dried by heating at 50-200° C. to remove the organic solvent content. Specifically, heating at 80° C. for 30 minutes is performed to remove the organic solvent content contained in the paste.

Next, a bonding jig 6 having a 0.1 mm-height wedge-like shape with an outward inclined face is placed enclosing the print-coated sinterable metal bonding paste (bond 3). Here, the top of the jig is formed to have an outward angle of 45 degrees with respect to the vertical side face of the semiconductor element 4. In order to more disperse the shear force acting on the cushioning 5, the angle preferably ranges from 45 degrees to less than 90 degrees. The height of the jig is determined according to the 0.3 mm thickness of the semiconductor element 4 to be mounted and a bond thickness of 0.05 mm after the sinterable metal bond sinters. That is, the sizes of the jig also need to be altered depending on the thickness of the semiconductor element 4 to be mounted and the bond thickness of the sintered metal bond.

The jig is formed of a material mainly containing Ni, which is not capable of adhering to the sinterable metal bonding paste (bond 3) used here. Selecting such a material allows for preventing the jig from not being detached from the base plate 1 after the thermal press bonding.

The semiconductor element 4 is placed on the dried sinterable metal bonding paste (the bond 3), and then heating at 200-400° C. is performed while applying a pressure of 10-50 MPa, to sinter the Ag nanoparticles. Specifically, a PTFE sheet of 40 mm square and 1 mm thickness is placed as the cushioning 5 on the plurality of semiconductor elements 4 so as to cover all of them together, and then applying a pressure of 30 MPa via the cushioning 5 and heating at a temperature of 280° C. for 15 minutes are performed, to bond the semiconductor elements 4 to the base plate electrode.

At that time, the top of the jig mitigates the shear force acting on the cushioning 5 at the edge of the semiconductor element 4 and disperses the force outwardly from the semiconductor element 4, whereby the cushioning 5, although plastically deformed, is not fractured. Thus, the bonding can be performed without the cushioning 5 being torn-off into fibrous pieces and being adhered to the surface of the semiconductor element 4. In addition, although a detail explanation is omitted, the cushioning and the jig becoming unnecessary after the bonding are removed by an appropriate method.

After the bonding, the base plate 1 is reflow soldered to another base plate in a reducing atmosphere and attached to a module case, and then wire bond connection and resin sealing are performed. In this way, the semiconductor module is manufactured. If a foreign substance originating from the cushioning 5 sticks to the surface of the semiconductor element 4, a trouble such as poor wire bonding may occur in a step, for example, the wire bonding step after the bonding step. However, since there is no sticking of such a foreign substance to the surface of the semiconductor element 4, no fault is detected in the wire bonding step.

Embodiment 5

Figure 12:
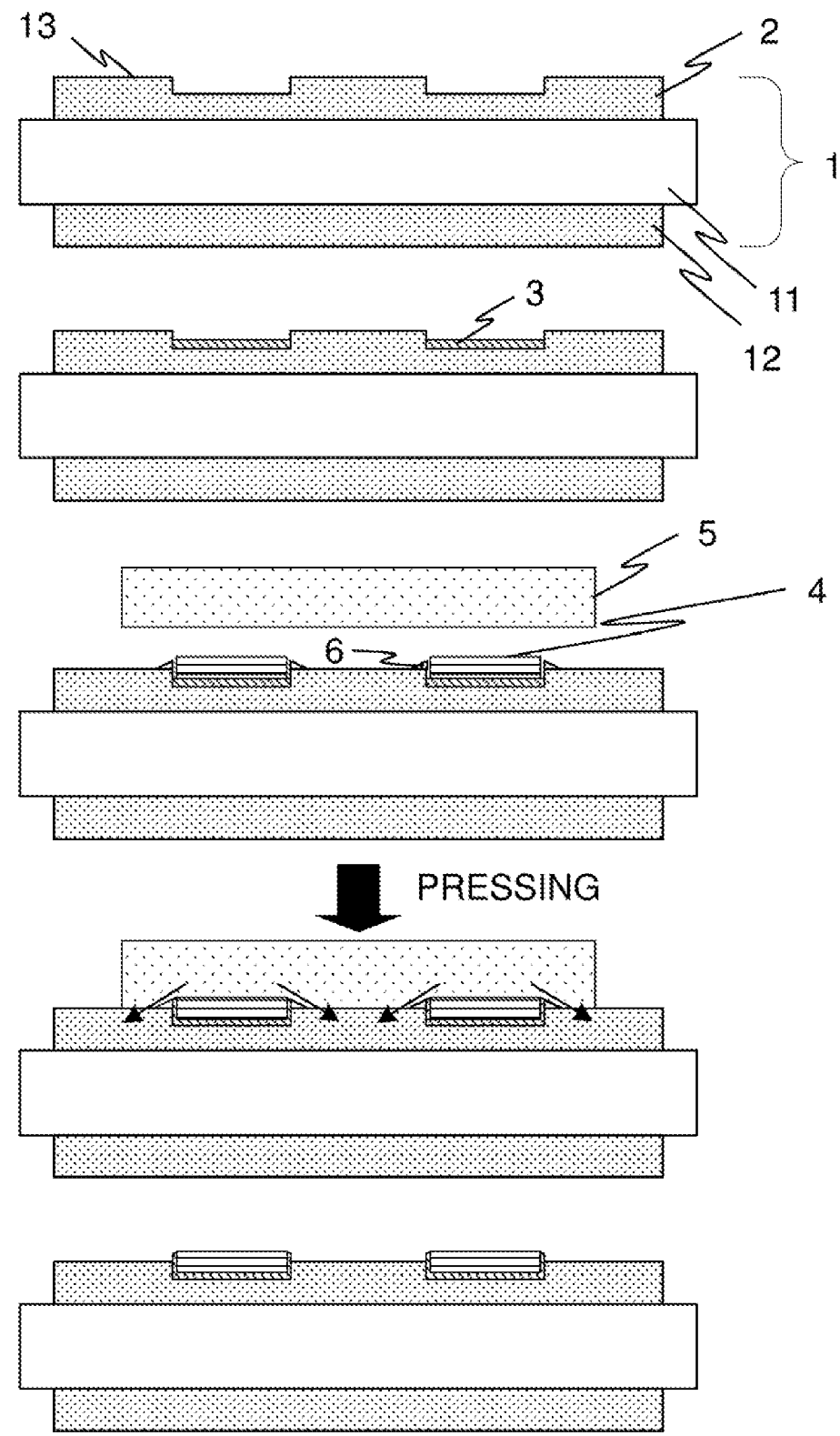
FIG. 12 is a series of schematic diagrams for explaining a bonding method for a semiconductor device according to Embodiment 6 of the present invention.
Figure 13:
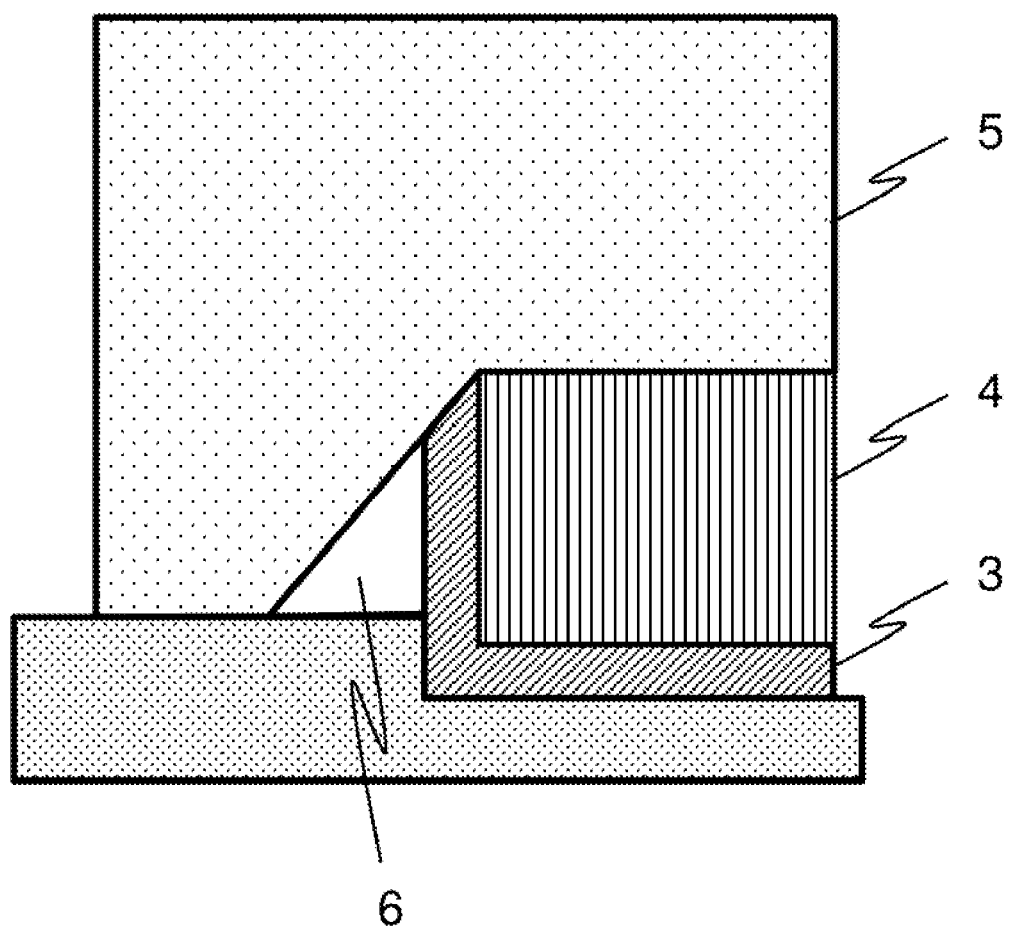
FIG. 13 is an enlarged diagram, among the diagrams in FIG. 12, showing the end portion of a semiconductor element used in the semiconductor device when thermally pressing processed.

FIG. 12 is a series of schematic diagrams for explaining a bonding method for a semiconductor device according to Embodiment 6 of the present invention, and FIG. 13 is an enlarged diagram, among the diagrams in FIG. 12, showing the end portion of a semiconductor element 4 used in the semiconductor device when thermally pressing processed.

A base plate 1 of 50 mm square and 1.2 mm thickness is used that is made up of a $Si_3N_4$ ceramic plate 11 (0.6 mm thickness) and Cu electrodes (0.3 mm thickness), one of which is the base plate electrode for mounting the semiconductor elements 4, brazed to both sides of the ceramic plate. The base plate electrode is formed to have two countersinks of 10.1 mm square and 0.1 mm depth at chip bonding areas.

The depression (countersink) are formed by mechanical grinding, so that the flat portion 13, where the semiconductor element 4 are not mounted, has a thickness of 0.3 mm and the depression for mounting the semiconductor element 4 has a thickness of 0.2 mm.

Next, part of the base pale 1 is print-coated with the sinterable metal bonding paste (bond 3) containing Ag nanoparticles. To be more specific, desired areas of the surface of the base plate electrode, each area having a size of 10 mm square, which is the same as that of the rear-side electrode of the semiconductor element 4, are coated with the sinterable metal bonding paste (bond 3) using a screen printer. The coating thickness is such that the bond thickness becomes 50 µm after the thermal press bonding. The print-coated sinterable metal bonding paste (bond 3) is dried by heating at 50-200° C. to remove the organic solvent content. Specifically, heating at 80° C. for 30 minutes is performed to remove the organic solvent content contained in the paste.

Next, a bonding jig 6 having a 0.1 mm-height wedge-like shape with an outward inclined face is placed enclosing the periphery of the depression formed in the base plate electrode. Here, the top of the jig is formed to have an outward angle of 60 degrees with respect to the vertical side face of the semiconductor element 4. In order to more disperse the shear force acting on the cushioning 5, the angle preferably ranges from 45 degrees to less than 90 degrees. The height of the jig is determined according to the 0.3 mm thickness of the semiconductor element 4 to be mounted and a bond thickness of 0.05 mm after the sinterable metal bond sinters. That is, the sizes of the jig also need to be altered depending on the thickness of the semiconductor element 4 to be mounted and the bond thickness of the sintered metal bond.

A material mainly containing Ni, which is not capable of adhering to the sinterable metal bonding paste (bond 3) used here, is selected as a material of the jig. Selecting such a material allows for preventing the jig from not being detached from the base plate 1 after the thermal press bonding.

The semiconductor element 4 is placed on the dried sinterable metal bonding paste (the bond 3), and then heating at 200-400° C. is performed while applying a pressure of 10-50 MPa, to sinter the Ag nanoparticles. Specifically, a PTFE sheet of 40 mm square and 1 mm thickness is placed as the cushioning 5 on the plurality of semiconductor elements 4 so as to cover all of them together, and then applying a pressure of 30 MPa via the cushioning 5 and heating at a temperature of 280° C. for 15 minutes are performed, to bond the semiconductor elements 4 to the base plate electrode.

At that time, the top of the jig mitigates the shear force acting on the cushioning 5 at the edge of the semiconductor element 4 and disperses the force outwardly from the semiconductor element 4, whereby the cushioning 5, although plastically deformed, is not fractured. Thus, the bonding can be performed without the cushioning 5 being torn-off into fibrous pieces and being adhered to the surface of the semiconductor element 4. In addition, although a detail explanation is omitted, the cushioning and the jig becoming unnecessary after the bonding are removed by an appropriate method.

After the bonding, the base plate 1 is reflow soldered to another base plate in a reducing atmosphere and attached to a module case, and then wire bond connection and resin sealing are performed. In this way, the semiconductor module is manufactured. If a foreign substance originating from the cushioning 5 sticks to the surface of the semiconductor element 4, a trouble such as poor wire bonding may occur in a step, for example, the wire bonding step after bonding step. However, since there is no sticking of such a foreign substance to the surface of the semiconductor element 4, no fault is detected in the wire bonding step.

Embodiment 7

Figure 14:
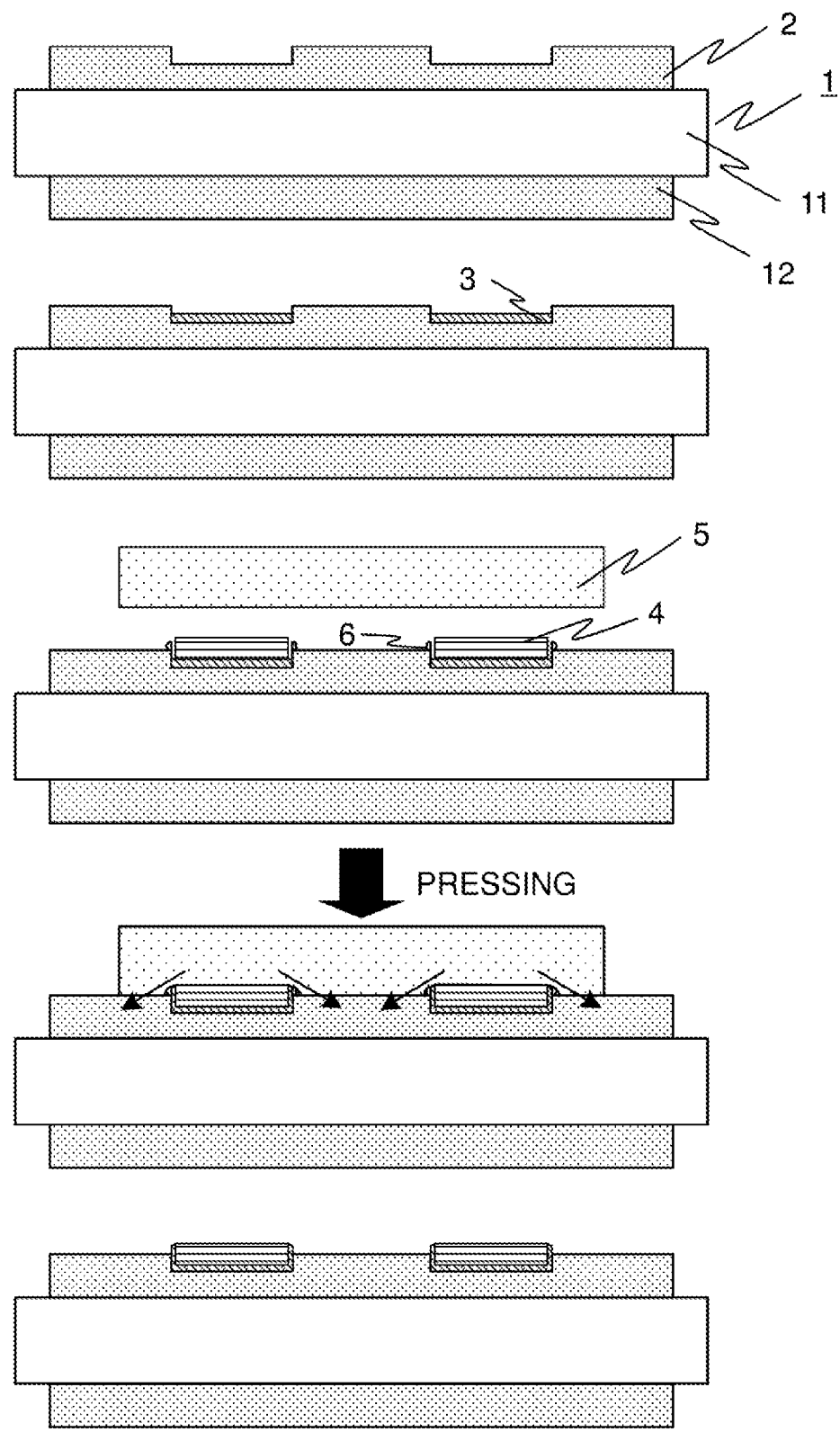
FIG. 14 is a series of diagrams for explaining a bonding method for a semiconductor device according to Embodiment 7 of the present invention.
Figure 15:
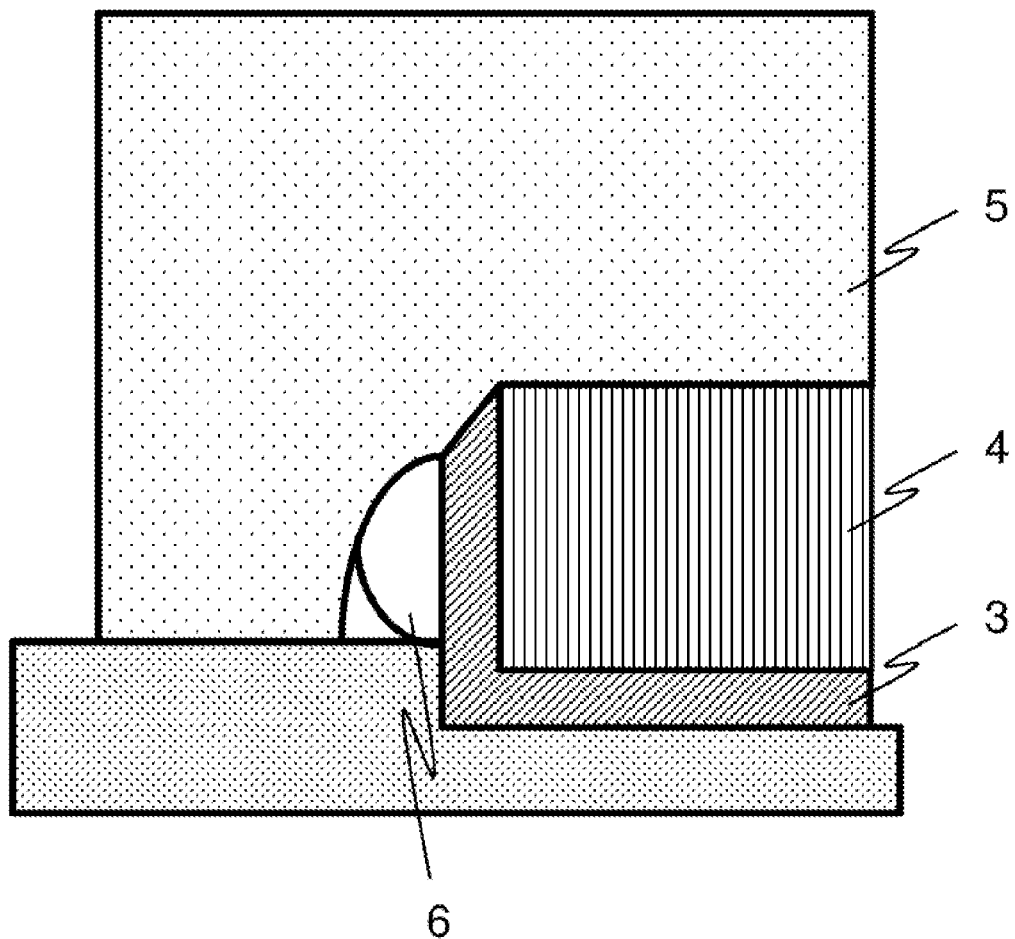
FIG. 15 is an enlarged diagram, among the diagrams in FIG. 14, showing the end portion of a semiconductor element used in the semiconductor device when thermally pressing processed.

FIG. 14 is a series of schematic diagrams for explaining a bonding method for a semiconductor device according to Embodiment 7 of the present invention, and FIG. 15 is an enlarged diagram, among the diagrams in FIG. 14, showing the end portion of a semiconductor element 4 used in the semiconductor device when thermally pressing processed.

A base plate 1 of 50 mm square and 1.2 mm thickness is used that is made up of a $Si_3N_4$ ceramic plate 11 (0.6 mm thickness) and Cu electrodes (0.3 mm thickness), one of which is the base plate electrode for mounting the semiconductor elements 4, brazed to both sides of the ceramic plate. The base plate electrode is formed to have two countersinks of 10.1 mm square and 0.1 mm depth at the chip bonding areas.

The depression (countersink) is formed by mechanical grinding, so that the flat portion 13, where the semiconductor element 4 is not mounted, has a thickness of 0.3 mm and the depression for mounting the semiconductor element 4 has a thickness of 0.2 mm.

Next, part of the base pale 1 is print-coated with the sinterable metal bonding paste (bond 3) containing Ag nanoparticles. To be more specific, desired areas of the surface of the base plate electrode, each area having a size of 10 mm square, which is the same as that of the rear-side electrode of the semiconductor element 4, are coated with the sinterable metal bonding paste (bond 3) using a screen printer. The coating thickness is such that the bond thickness becomes 50 μm after the thermal press bonding. The print-coated sinterable metal bonding paste (bond 3) is dried by heating at 50-200° C. to remove the organic solvent content. Specifically, heating at 80° C. for 30 minutes is performed to remove the organic solvent content contained in the paste.

Next, a bonding jig 6 having an outward semi-circular shape of 0.1 mm height is placed enclosing the periphery of the depression formed in the base plate electrode. Here, the height of the semi-circular shaped jig is set to less than a value obtained by subtracting the depth of the countersinked depression from the thickness of the semiconductor element 4. In order to more disperse the shear force acting on the cushioning 5, the height preferably ranges from 80% to less than 100% of the subtracted value. The height of the jig is determined according to the 0.3 mm thickness of the semiconductor element 4 to be mounted and a bond thickness of 0.05 mm after the sinterable metal bond sinters. That is, the sizes of the jig also need to be altered depending on the thickness of the semiconductor element 4 to be mounted and the bond thickness of the sintered metal bond.

A material mainly containing Ni, which is not capable of adhering to the sinterable metal bonding paste (bond 3) used here, is selected as a material of the jig. Selecting such a material allows for preventing the jig from not being detached from the base plate 1 after the thermal press bonding.

The semiconductor element 4 is placed on the dried sinterable metal bonding paste (the bond 3), and then heating at 200-400° C. is performed while applying a pressure of 10-50 MPa, to sinter the Ag nanoparticles. Specifically, a PTFE sheet of 40 mm square and 1 mm thickness is placed as the cushioning 5 on the plurality of semiconductor elements 4 so as to cover all of them together, and then applying a pressure of 30 MPa via the cushioning 5 and heating at a temperature of 280° C. for 15 minutes are performed, to bond the semiconductor elements 4 to the base plate electrode.

At that time, the top of the jig mitigates the shear force acting on the cushioning 5 at the edge of the semiconductor element 4 and disperses the force outwardly from the semiconductor element 4, whereby the cushioning 5, although plastically deformed, is not fractured. Thus, the bonding can be performed without the cushioning 5 being torn-off into fibrous pieces and being adhered to the surface of the semiconductor element 4. In addition, although a detail explanation is omitted, the cushioning and the jig becoming unnecessary at this stage after the bonding are removed by an appropriate method.

After the bonding, the base plate 1 is reflow soldered to another base plate in a reducing atmosphere and attached to a module case, and then wire bond connection and resin sealing are performed. In this way, the semiconductor module is manufactured. If a foreign substance originating from the cushioning 5 sticks to the surface of the semiconductor element 4, a trouble such as poor wire bonding may occur in a step, for example, the wire bonding step after the bonding step. However, since there is no sticking of such a foreign substance to the surface of the semiconductor element 4, no fault is detected in the wire bonding step.

As described above, according to the present invention, the cushioning 5 used in the thermal press bonding with a bond, which is a sinterable metal bond, can be prevented from adhering to the surface of the semiconductor element 4. It should be noted that each embodiment of the present invention may be freely combined or appropriately modified or omitted within the spirit and the scope of the invention.

REFERENCE NUMERALS

1: base plate (insulating base plate);
2: base plate electrode;
3: sinterable metal bond (bond, sinterable metal bonding paste);
4: semiconductor element;
5: cushioning (PTFE);
6: jig;
11: ceramic plate;
12: rear-side electrode;
13: flat portion;
20: Plating resist masks; and
21: Cu plating film.

The invention claimed is:

1. A semiconductor device comprising:
    a semiconductor element; and
    an insulating base plate including a base plate electrode on a surface of the insulating base plate,
    wherein the base plate electrode includes a wedge-shape protrusion along a periphery of a bonding area where the semiconductor element is mounted on the base plate electrode, and
    wherein a sinterable metal bond binds the semiconductor element to the base plate electrode and the wedge-shape protrusion forms an incline from a point of the periphery closest to the semiconductor element toward a planar portion of the base plate electrode outside of the bonding area.

2. The semiconductor device of claim 1, wherein the protrusion is formed along the periphery of the bonding area, the bonding area being coated with the sinterable metal bond.

3. The semiconductor device of claim 1, wherein the semiconductor element is a wide gap semiconductor made up of one or more of silicon carbide, gallium-nitride-based material, or diamond.

4. The semiconductor device of claim 1, wherein the semiconductor element has arc-shape side faces or beveled side faces surrounding a constant thickness portion of the semiconductor element.

5. A method of manufacturing a semiconductor device that is manufactured by implementing a semiconductor element on an insulating base plate by bonding the semiconductor element to the insulating base plate with a sinterable metal bond, the method of manufacturing a semiconductor device comprising:
    coating with the sinterable metal bond an area of a base plate electrode provided on the insulating base plate;
    attaching, to the base plate electrode along a periphery of an area coated with the sinterable metal bond, a jig made of a material containing Ni, the jig not adhering to the sinterable metal bond and including a wedge-shape top having an outward face inclined at an angle of 45 degrees to less than 90 degrees with respect to a side face of the semiconductor element;
    placing the semiconductor element on the sinterable metal bond inside the protrusion of the jig; and thermal pressing the semiconductor element via a cushioning placed covering the semiconductor element, to bond the semiconductor element to the insulating plate.

6. A method of manufacturing a semiconductor device that is manufactured by implementing a semiconductor element on an insulating base plate by bonding the semiconductor element to the insulating base plate with a sinterable metal bond, the method of manufacturing a semiconductor device comprising:

coating with the sinterable metal bond a depression formed in a base plate electrode provided on the insulating base plate;

attaching, to the base plate electrode at a position circumscribed about an upper edge of the depression, a jig made of a material containing Ni, the jig not adhering to the sinterable metal bond and including an acute angled top formed to have an outward face inclined at an angle of 45 degrees to less than 90 degrees with respect to a side face of the semiconductor element;

placing the semiconductor element on the sinterable metal bond inside the depression; and thermal pressing the semiconductor element via a cushioning placed covering the semiconductor element, to bond the semiconductor element to the insulating plate.

7. The method of manufacturing a semiconductor device of claim 6, wherein the depression in the base plate electrode is coated with the sinterable metal bond so that the semiconductor element is bonded with the sinterable metal bond to the insulating base plate at a bottom face and side faces of the semiconductor element by the thermal pressing.

* * * * *